(12) United States Patent
Taki

(10) Patent No.: US 8,076,684 B2
(45) Date of Patent: Dec. 13, 2011

(54) GROUP III INTRIDE SEMICONDUCTOR LIGHT EMITTING ELEMENT

(75) Inventor: Tetsuya Taki, Aichi-ken (JP)

(73) Assignee: Toyoda Gosei Co., Ltd., Aichi-Ken (JP)

( * ) Notice: Subject to any disclaimer, the term of this patent is extended or adjusted under 35 U.S.C. 154(b) by 413 days.

(21) Appl. No.: 11/783,110

(22) Filed: Apr. 5, 2007

(65) Prior Publication Data

US 2007/0241353 A1 Oct. 18, 2007

(30) Foreign Application Priority Data

Apr. 7, 2006 (JP) .................................. 2006-106805

(51) Int. Cl.
*H01L 29/06* (2006.01)

(52) U.S. Cl. ............ 257/97; 257/14; 257/191; 257/103; 438/22

(58) Field of Classification Search ..................... 257/89, 257/90, 96, 97, 14, 191, 101, 103
See application file for complete search history.

(56) References Cited

U.S. PATENT DOCUMENTS

| | | | | |
|---|---|---|---|---|
| 5,473,173 | A * | 12/1995 | Takiguchi et al. | 257/185 |
| 5,670,798 | A * | 9/1997 | Schetzina | 257/96 |
| 5,684,309 | A * | 11/1997 | McIntosh et al. | 257/191 |
| 5,895,225 | A * | 4/1999 | Kidoguchi et al. | 438/47 |
| 5,977,612 | A * | 11/1999 | Bour et al. | 257/618 |
| 6,169,298 | B1 * | 1/2001 | Lin et al. | 257/103 |
| 6,459,100 | B1 * | 10/2002 | Doverspike et al. | 257/97 |
| 6,504,171 | B1 * | 1/2003 | Grillot et al. | 257/14 |
| 6,734,467 | B2 * | 5/2004 | Schlereth et al. | 257/89 |
| 7,323,721 | B2 * | 1/2008 | Liao et al. | 257/90 |
| 2006/0126688 | A1 * | 6/2006 | Kneissl | 372/43.01 |
| 2007/0045609 | A1 * | 3/2007 | Saxler | 257/14 |

FOREIGN PATENT DOCUMENTS

| | | |
|---|---|---|
| JP | 58-197784 A | 11/1983 |
| JP | 10-22525 | 1/1998 |
| JP | 10-022525 | 1/1998 |
| JP | 2000-196143(A) | 7/2000 |
| JP | 2004-128443 A | 4/2004 |

OTHER PUBLICATIONS

A study on wavelength stability of GaN-based blue light emitting diodes, Lou, Yi et. al., Acta Physica Sinica, vol. 53(8), pp. 2720-2723, Aug. 31, 2004.
Japanese Office Action dated Jul. 18, 2008 with English-Language Translation.
English-Language Translation of "A study on wavelength stability of GaN-based blue light emitting diodes", Luo, Yi et al., Acta Physica Sinica, vol. 53(8), Aug. 2004, pp. 2720-2723.
Japanese Office Action dated Dec. 21, 2010 with a partial English translation.
A study on wavelength stability of GaN-based blue light emitting diodes, Lou, Yi et. al., Acta Physics Sinica, vol. 53(8), pp. 2720-2723, Aug. 31, 2004.

(Continued)

*Primary Examiner* — Steven Loke
*Assistant Examiner* — David Goodwin
(74) *Attorney, Agent, or Firm* — McGinn IP Law Group, PLLC

(57) ABSTRACT

A group III nitride semiconductor light emitting element, comprising having a light emitting layer with a multiquantum well structure formed of a group III nitride semiconductor. The light emitting layer has plural well layers, and the plural well layers are formed to coincide in emission wavelength with each other.

2 Claims, 4 Drawing Sheets

OTHER PUBLICATIONS

Chinese Office Action dated Jul. 18, 2008 with English-Language Translation.

Japanese Office Action dated May 24, 2011 with a partial English translation.

* cited by examiner

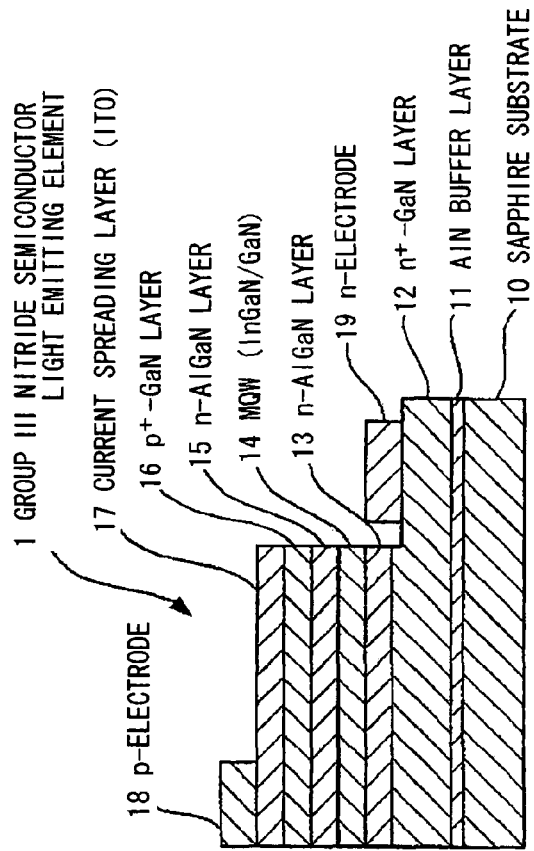
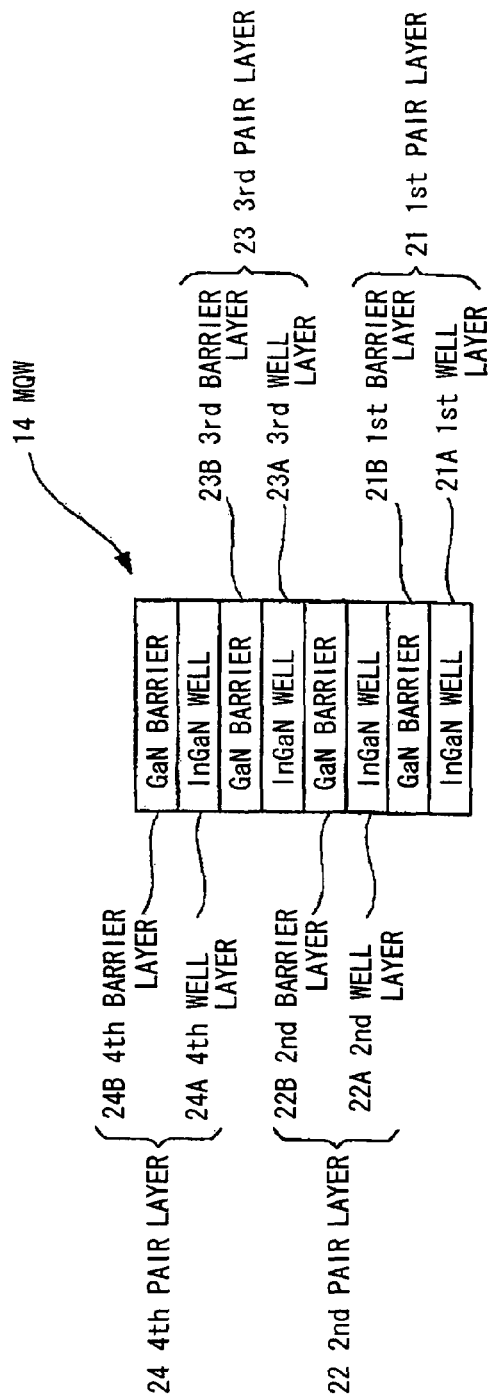
FIG. 1A
FIG. 1B

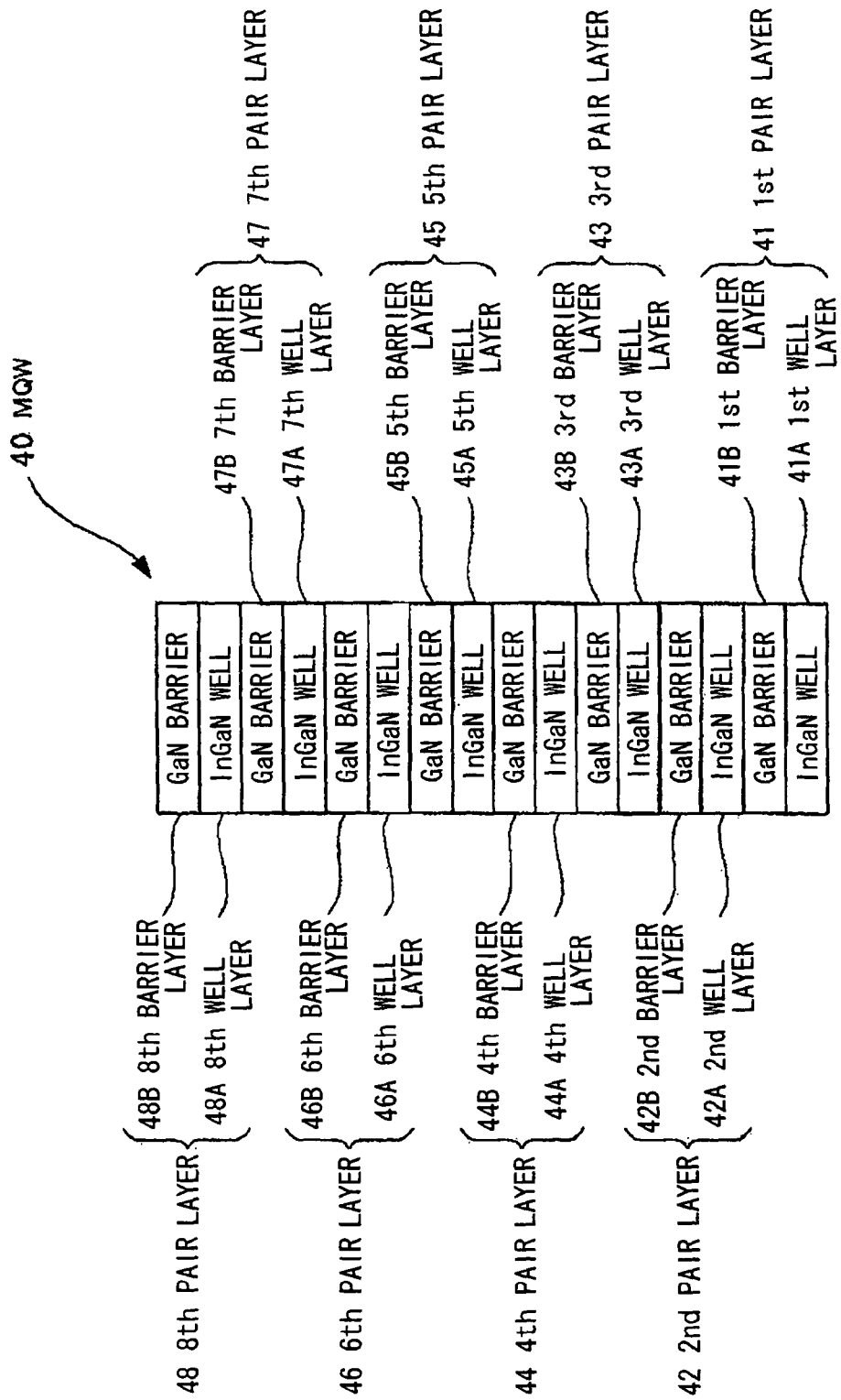

GROUP III INTRIDE SEMICONDUCTOR LIGHT EMITTING ELEMENT

The present application is based on Japanese patent application No.2006-106805, the entire contents of which are incorporated herein by reference.

BACKGROUND OF THE INVENTION

1. Field of the Invention

This invention relates to a group III nitride semiconductor light emitting element and, in particular, to a group III nitride semiconductor light emitting element that uses as a light emitting layer an MQW (multiquantum well) structure with a well layer such as InGaN layer.

2. Description of the Related Art

In recent years, light emitting apparatuses using a semiconductor element (light emitting element) such as an LED (light emitting diode) and a LD (laser diode) are widely used as a light source since they are smaller, more excellent in power efficiency or longer in lifetime than light bulbs.

In such a semiconductor light emitting element, a blue/green light emitting diode and a violet semiconductor laser diode using an active layer (light emitting layer) with an $In_xGa_{1-x}N$ MQW structure have been commercialized already.

A conventional group III nitride semiconductor light emitting element is known that plural well layers composing the light emitting layer are set to be different from each other in composition ratio of components to compose the well layers (e.g., JP-A-10-022525).

However, the conventional group III nitride semiconductor light emitting element has a problem that the well layers each have an emission wavelength different from each other to cause deterioration in color purity and reduction in emission intensity, since the screening effect is different between the well layers due to a difference in piezooptical effect level and in carrier concentration therebetween.

SUMMARY OF THE INVENTION

It is an object of the invention to provide a group III nitride semiconductor light emitting element that has well layers to-coincide in emission wavelength with each other to achieve excellent color purity and to enhance the emission intensity.

According to one embodiment of the invention, a group III nitride semiconductor light emitting element comprises:

a light emitting layer comprising a multiquantum well structure comprising a group III nitride semiconductor, wherein the light emitting layer comprises a plurality of well layers, and the plurality of well layers are formed to coincide in emission wavelength with each other.

In the above invention, the following modifications and changes can be made.

(i) The light emitting layer comprises a plurality of pair layers, each of the pair layers comprising a well layer and a barrier layer, the light emitting element further comprises a p-semiconductor layer, and the barrier layer is situated nearer the p-semiconductor layer in relation to the well layer.

(ii) The plurality of well layers comprises InGaN, and the plurality of well layers are different from each other in composition ratio of the InGaN. The light emitting element further comprises an n-semiconductor layer and a p-semiconductor layer, and an In composition ratio of the InGaN decreases in a direction from the n-semiconductor layer to the p-semiconductor layer.

(iii) The plurality of well layers comprises InGaN and silicon (Si) doped as an impurity, and the plurality of well layers are different from each other in doping amount of the Si. The light emitting element further comprises an n-semiconductor layer and a p-semiconductor layer, and the Si doping amount increases in a direction from the n-semiconductor layer to the p-semiconductor layer.

(iv) The plurality of well layers comprises InGaN, and the plurality of well layers are different from each other in thickness. The light emitting element further comprises an n-semiconductor layer and a p-semiconductor layer, and the thickness decreases in a direction from the n-semiconductor layer to the p-semiconductor layer.

(v) The plurality of well layers comprises InGaN, and the plurality of well layers are different from each other in bandgap width. The light emitting element further comprises an n-semiconductor layer and a p-semiconductor layer, and a bandgap width of the plurality of well layers increases in a direction from the n-semiconductor layer to the p-semiconductor layer.

(vi) The light emitting element further comprises an n-semiconductor layer and a p-semiconductor layer, and the bandgap width increases in a direction from the n-semiconductor layer to the p-semiconductor layer.

BRIEF DESCRIPTION OF THE DRAWINGS

The preferred embodiments according to the invention will be explained below referring to the drawings, wherein:

FIG. 1A is a schematic cross sectional view showing a group III nitride semiconductor light emitting element in a first preferred embodiment according to the invention;

FIG. 1B is a schematic cross sectional view showing a light emitting layer of the light emitting element in FIG. 1A;

FIG. 4 is a schematic cross sectional view showing a light emitting layer of a group III nitride semiconductor light emitting element in a second preferred embodiment according to the invention.

DETAILED DESCRIPTION OF THE PREFERRED EMBODIMENTS

First Embodiment

Figure 2A:
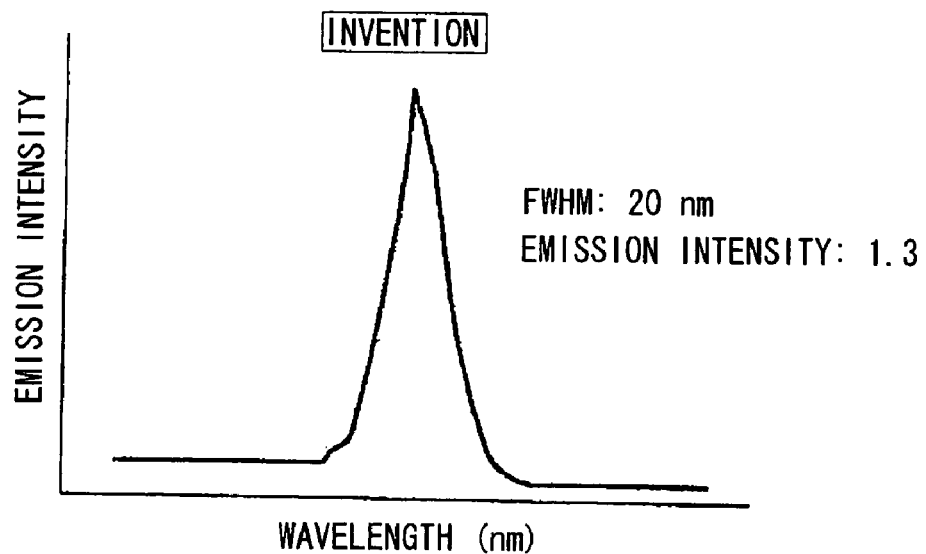
FIG. 2A is a diagram showing an emission spectrum of light emitted from the group III nitride semiconductor light emitting element of the first embodiment.

FIG. 1A is a schematic cross sectional view showing a group III nitride semiconductor light emitting element in the first preferred embodiment according to the invention. FIG. 1B is a schematic cross sectional view showing a light emitting layer of the light emitting element in FIG. 1A.

As shown in FIG. 1A, the group III nitride semiconductor light emitting element 1 comprises a p-side electrode 18 and an n-side electrode 19, and further comprises an AlN buffer layer 11 grown on a sapphire substrate under low-temperature growth conditions, an Si-doped $n^+$-GaN layer 12, an Si-doped n-AlGaN layer 13, an MQW 14 with a multiquantum well structure formed of InGaN/GaN, an Mg-doped p-AlGaN layer 15, an Mg-doped p$^+$-GaN layer 16, and a current spreading layer 17 as a conductive film, which are stacked sequentially. It functions as a blue LED element to emit, e.g., a bluish light with an emission wavelength of 460 nm to 463 nm.

The AlN buffer layer 11 is formed by supplying trimethylgallium (TMG) into a reactor in which the sapphire substrate 10 is placed under a growth temperature condition of 350° C. to 550° C. (preferably 400° C. to 550° C.) while using H$_2$ as a carrier gas.

The n$^+$-GaN layer 12 and the p$^+$-GaN layer 16 are formed by supplying NH$_3$ and trimethylgallium (TMG) into the reactor under a growth temperature condition of 1100° C. while using H$_2$ as a carrier gas. Monosilane as an Si source is used for a dopant to provide n-type conductivity with the n$^+$-GaN layer 12, and cyclopentadienyl magnesium (Cp$_2$Mg) as an Mg source used for a dopant to provide p-type conductivity with the p$^+$-GaN layer 16.

The n-AlGaN layer 13 and the p-AlGaN layer 15 are formed by supplying NH$_3$, TMG and trimethylaluminum (TMA) into the reactor under a temperature condition of 1100° C. SiH$_4$ as an Si source is used for a dopant to provide n-type conductivity with the n-AlGaN layer 13, and cyclopentadienyl magnesium (Cp$_2$Mg) as an Mg source used for a dopant to provide p-type conductivity with the p-AlGaN layer 15.

As shown in FIG. 1B, the MQW 14 is formed with a light emitting layer comprising a first pair layer 21 to a fourth pair layer 24, each being formed of a group III nitride semiconductor. A first well layer to a fourth well layer to compose the MQW 14 are each formed under growth conditions to coincide in emission wavelength with each other, as mentioned later. Si is doped as an impurity into the second well layer to the fourth well layer. The amount of the Si doped is set to increase gradually from the n-semiconductor layer side to the p-semiconductor layer side. The thickness of the first well layer to the fourth well layer is set to decrease gradually from the n-semiconductor layer side to the p-semiconductor layer side. The group III nitride semiconductor means at least group III-V nitride semiconductor represented by In$_x$Ga$_{1-x}$N (where $0 \leq x \leq 1$). In$_x$ (x: composition ratio) is set to have composition ratios to decrease gradually from the n-semiconductor layer side to the p-semiconductor layer side. The MQW 14 is formed by supplying NH$_3$, TMG and trimethylindium (TMI) into the reactor under a growth temperature condition of 700° C. to 900° C. while using N$_2$ as a carrier gas.

The first pair layer 21 is composed of the first well layer 21A and a first barrier layer 21B, and formed on the n-AlGaN 13. The first well layer 21A is disposed on the n-semiconductor layer side in relation to the first barrier layer 21B, and formed of an In$_{0.26}$Ga$_{0.74}$N layer with a thickness of about 38 Å. It is adapted to emit bluish light with an emission wavelength of 460 nm to 463 nm. The first barrier layer 21B is disposed on the p-semiconductor layer side in relation to the first well layer 21A, and formed of a GaN layer with a thickness of about 5 nm.

A second pair layer 22 is composed of a second well layer 22A and a second barrier layer 22B, and formed on the first pair layer 21. The second well layer 22A is disposed on the n-semiconductor layer side in relation to the second barrier layer 22B, and formed of an In$_{0.23}$Ga$_{0.77}$N layer with a thickness of about 34 Å. It is adapted to emit bluish light with an emission wavelength of 460 nm to 463 nm. The second well layer 22A is doped with an impurity, silicon (Si) at a doping amount of about $2 \times 10^{-7}$ cm$^{-3}$. The second barrier, layer 22B is disposed on the p-semiconductor layer side in relation to the second well layer 22A, and formed of a GaN layer with a thickness of about 5 nm.

A third pair layer 23 is composed of a third well layer 23A and a third barrier layer 23B, and formed on the second pair layer 22. The third well layer 23A is disposed on the n-semiconductor layer side in relation to the third barrier layer 23B, and formed of an In$_{0.20}$Ga$_{0.80}$N layer with a thickness of about 30 Å. It is adapted to emit bluish light with an emission wavelength of 460 nm to 463 nm. The third well layer 23A is doped with an impurity, silicon (Si) at a doping amount of about $4 \times 10^{-7}$ cm$^{-3}$. The third barrier layer 23B is disposed on the p-semiconductor layer side in relation to the third well layer 23A, and formed of a GaN layer with a thickness of about 5 nm.

The fourth pair layer 24 is composed of a fourth well layer 24A and a fourth barrier layer 24B, and formed on the third pair layer 23. The fourth well layer 24A is disposed on the n-semiconductor layer side in relation to the fourth barrier layer 24B, and formed of an In$_{0.17}$Ga$_{0.83}$N layer with a thickness of about 26 Å. It is adapted to emit bluish light with an emission wavelength of 460 nm to 463 nm. The fourth well layer 24A is doped with an impurity, silicon (Si) at a doping amount of about $6 \times 10^{-7}$ cm$^{-3}$. The fourth barrier layer 24B is disposed on the p-semiconductor layer side in relation to the fourth well layer 24A, and formed of a GaN layer with a thickness of about 5 nm.

The In (=indium) composition ratio, thickness and Si doping concentration of the first well layer 21A to the fourth well layer 24A are as shown in Table 1.

TABLE 1

|  | In composition ratio (%) | Thickness (Å) | Si doping amount (cm$^{-3}$) |
| --- | --- | --- | --- |
| Fourth well layer | 17 | 26 | $6 \times 10^{-7}$ |
| Third well layer | 20 | 30 | $4 \times 10^{-7}$ |
| Second well layer | 23 | 34 | $2 \times 10^{-7}$ |
| First well layer | 26 | 38 | 0 |

The current spreading layer 17 is disposed on the p$^+$-GaN layer 16, and formed of a transparent electrode made of Indium tin oxide (ITO).

The p-side electrode 18 is formed on the surface of the current spreading layer 17, and the n-side electrode 19 is formed on the surface of the n$^+$-GaN layer 12 exposed by etching.

In applying a voltage from a power source to the group III nitride semiconductor light emitting element 1 thus structured, light emitted from the MQW 14 is observed where an emission spectrum with a sharp emission wavelength peak (emission wavelength: 460 nm to 463 nm) is confirmed. This is as shown in FIG. 2A where the vertical axis indicates emission intensity and the horizontal axis indicates wavelength. As shown in FIG. 2A, the emission spectrum observed has an FWHM (=full-width at half-maximum) of 20 nm.

Figure 2B:
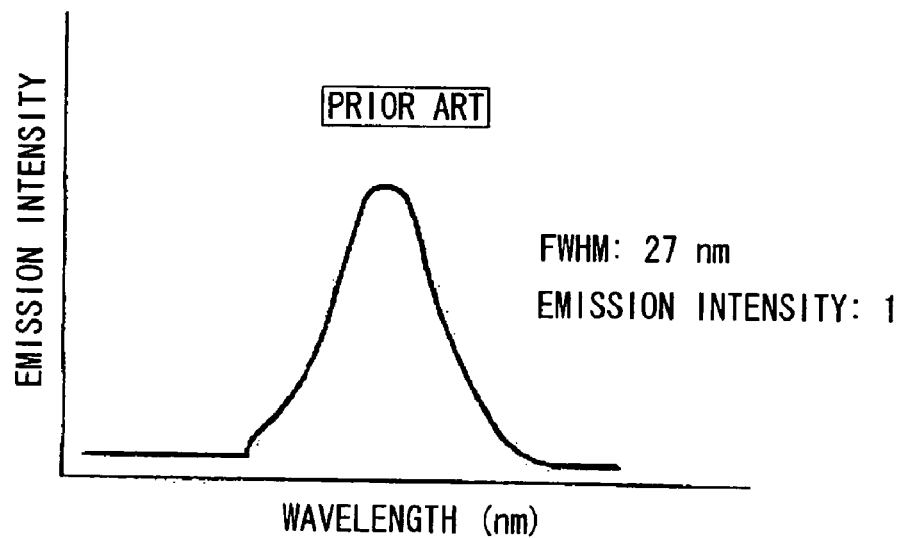
FIG. 2B is a diagram showing an emission spectrum of light emitted from a conventional group III nitride semiconductor light emitting element.

In contrast, as shown in FIG. 2B, the emission spectrum of light emitted from a conventional MQW has an emission wavelength peak of 440 nm to 470 nm and an FWHM of 27 nm.

In addition, as shown in FIGS. 2A and 2B, the emission intensity of this embodiment can be enhanced to 1.3 relative to 1 in case of the conventional MQW.

The following effects can be obtained by the first embodiment as mentioned above.

Since the first well layer 21 to the fourth well layer 24 are each formed to coincide in emission wavelength with each other, excellent color purity can be achieved and the emission intensity can be enhanced.

Second Embodiment

Figure 3:
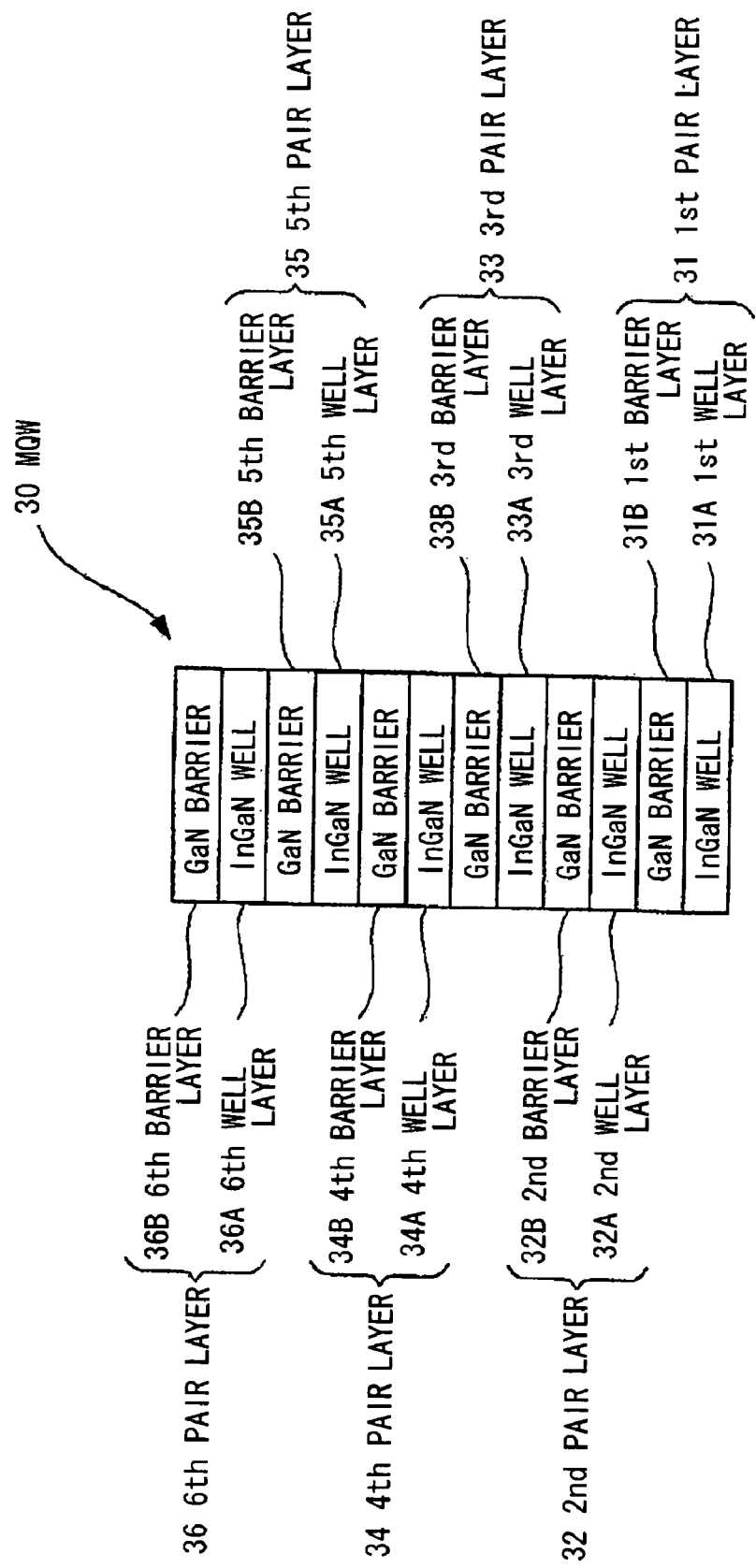
FIG. 3 is a schematic cross sectional view showing a light emitting layer of a group III nitride semiconductor light emitting element in a second preferred embodiment according to the invention.

FIG. 3 is a schematic cross sectional view showing a light emitting layer of a group III nitride semiconductor light emitting element in the second preferred embodiment according to the invention.

As shown in FIG. 3, an MQW 30 of the group III nitride semiconductor light emitting element of the second embodiment is formed with the light emitting layer comprising a first pair layer 31 to a sixth pair layer 36, each being formed of a group III nitride semiconductor. A first well layer to a sixth well layer to compose the MQW 30 are each formed under growth conditions to coincide in emission wavelength with each other, as mentioned later. Si is doped as an impurity into the second well layer to the sixth well layer. The amount of the Si doped is set to increase gradually from the n-semiconductor layer side to the p-semiconductor layer side. The thickness of the first well layer to the sixth well layer is set to decrease gradually from the n-semiconductor layer side to the p-semiconductor layer side. The group III nitride semiconductor means at least group III-V nitride semiconductor represented by $In_xGa_{1-x}N$ (where $0 \leq x \leq 1$). $In_x$ (x: composition ratio) is set to have composition ratios to decrease gradually from the n-semiconductor layer side to the p-semiconductor layer side. The MQW 30 is formed by supplying $NH_3$, TMG and TMI into the reactor under a growth temperature condition of 700° C. to 900° C. while using $N_2$ as a carrier gas.

The first pair layer 31 is composed of the first well layer 31A and a first barrier layer 31B, and formed on the n-AlGaN 13 as shown in FIG. 1A. The first well layer 31A is disposed on the n-semiconductor layer side in relation to the first barrier layer 31B, and formed of an $In_{0.26}Ga_{0.74}N$ layer with a thickness of about 39 Å. It is adapted to emit bluish light with an emission wavelength of 460 nm to 463 nm. The first barrier layer 31B is disposed on the p-semiconductor layer side in relation to the first well layer 31A, and formed of a GaN layer with a thickness of about 5 nm.

A second pair layer 32 is composed of a second well layer 32A and a second barrier layer 32B, and formed on the first pair layer 31. The second well layer 32A is disposed on the n-semiconductor layer side in relation to the second barrier layer 32B, and formed of an $In_{0.24}Ga_{0.76}N$ layer with a thickness of about 36 Å. It is adapted to emit bluish light with an emission wavelength of 460 nm to 463 nm. The second well layer 32A is doped with an impurity, silicon (Si) at a doping amount of about $1 \times 10^{-7}$ $cm^{-3}$. The second barrier layer 32B is disposed on the p-semiconductor layer side in relation to the second well layer 32A, and formed of a GaN layer with a thickness of about 5 nm.

A third pair layer 33 is composed of a third well layer 33A and a third barrier layer 33B, and formed on the second pair layer 32. The third well layer 33A is disposed on the n-semiconductor layer side in relation to the third barrier layer 33B, and formed of an $In_{0.22}Ga_{0.78}N$ layer with a thickness of about 30 Å. It is adapted to emit bluish light with an emission wavelength of 460 nm to 463 nm. The third well layer 33A is doped with an impurity, silicon (Si) at a doping amount of about $2 \times 10^{-7}$ $cm^{-3}$. The third barrier layer 33B is disposed on the p-semiconductor layer side in relation to the third well layer 33A, and formed of a GaN layer with a thickness of about 5 nm.

A fourth pair layer 34 is composed of a fourth well layer 34A and a fourth barrier layer 34B, and formed on the third pair layer 33. The fourth well layer 34A is disposed on the n-semiconductor layer side in relation to the fourth barrier layer 34B, and formed of an $In_{0.20}Ga_{0.80}N$ layer with a thickness of about 30 Å. It is adapted to emit bluish light with an emission wavelength of 460 nm to 463 nm. The fourth well layer 34A is doped with an impurity, silicon (Si) at a doping amount of about $3 \times 10^{-7}$ $cm^{-3}$. The fourth barrier layer 34B is disposed on the p-semiconductor layer side in relation to the fourth well layer 34A, and formed of a GaN layer with a thickness of about 5 nm.

A fifth pair layer 35 is composed of a fifth well layer 35A and a fifth barrier layer 35B, and formed on the fourth pair layer 34. The fifth well layer 35A is disposed on the n-semiconductor layer side in relation to the fifth barrier layer 35B, and formed of an $In_{0.18}Ga_{0.82}N$ layer with a thickness of about 27 Å. It is adapted to emit bluish light with an emission wavelength of 460 nm to 463 nm. The fifth well layer 35A is doped with an impurity, silicon (Si) at a doping amount of about $4 \times 10^{-7}$ $cm^{-3}$. The fifth barrier layer 35B is disposed on the p-semiconductor layer side in relation to the fifth well layer 35A, and formed of a GaN layer with a thickness of about 5 nm.

The sixth pair layer 36 is composed of a sixth well layer 36A and a sixth barrier layer 36B, and formed on the fifth pair layer 35. The sixth well layer 36A is disposed on the n-semiconductor layer side in relation to the sixth barrier layer 36B, and formed of an $In_{0.16}Ga_{0.84}N$ layer with a thickness of about 24 Å. It is adapted to emit bluish light with an emission wavelength of 460 nm to 463 nm. The sixth well layer 36A is doped with an impurity, silicon (Si) at a doping amount of about $5 \times 10^{-7}$ $cm^{-3}$. The sixth barrier layer 36B is disposed on the p-semiconductor layer side in relation to the sixth well layer 36A, and formed of a GaN layer with a thickness of about 5 nm.

The In (indium) composition ratio, thickness and Si doping concentration of the first well layer 31A to the sixth well layer 36A are as shown in Table 2.

TABLE 2

|  | In composition ratio (%) | Thickness (Å) | Si doping amount ($cm^{-3}$) |
| --- | --- | --- | --- |
| Sixth well layer | 16 | 24 | $5 \times 10^{-7}$ |
| Fifth well layer | 18 | 27 | $4 \times 10^{-7}$ |
| Fourth well layer | 20 | 30 | $3 \times 10^{-7}$ |
| Third well layer | 22 | 33 | $2 \times 10^{-7}$ |
| Second well layer | 24 | 36 | $1 \times 10^{-7}$ |
| First well layer | 26 | 39 | 0 |

The same effects as the first embodiment can be obtained by the second embodiment as mentioned above.

Third Embodiment

FIG. 4 is a schematic cross sectional view showing a light emitting layer of a group III nitride semiconductor light emitting element in the third preferred embodiment according to the invention.

As shown in FIG. 4, an MQW 40 of the group III nitride semiconductor light emitting element of the third embodiment is formed with the light emitting layer comprising a first pair layer 41 to an eighth pair layer 48, each being formed of a group III nitride semiconductor. A first well layer to an eighth well layer to compose the MQW 40 are each formed under growth conditions to coincide in emission wavelength with each other, as mentioned later. Si is doped as an impurity into the second well layer to the eighth well layer. The amount of the Si doped is set to increase gradually from the n-semiconductor layer side to the p-semiconductor layer side. The thickness of the first well layer to the eighth well layer is set to decrease gradually from the n-semiconductor layer side to the p-semiconductor layer side. The group III nitride semiconductor means at least group III-V nitride semiconductor represented by $In_xGa_{1-x}N$ (where $0 \leq x \leq 1$). $In_x$ (x: composition ratio) is set to have composition ratios to decrease gradually from the n-semiconductor layer side to the p-semiconductor layer side. The MQW 40 is formed by supplying $NH_3$, TMG and TMI into the reactor under a growth temperature condition of 700° C. to 900° C. while using $N_2$ as a carrier gas.

The first pair layer 41 is composed of the first well layer 41A and a first barrier layer 41B, and formed on the n-AlGaN 13 as shown in FIG. 1A. The first well layer 41A is disposed on the n-semiconductor layer side in relation to the first barrier layer 41B, and formed of an $In_{0.29}Ga_{0.71}N$ layer with a thickness of about 42 Å. It is adapted to emit bluish light with an emission wavelength of 460 nm to 463 nm. The first barrier layer 41B is disposed on the p-semiconductor layer side in relation to the first well layer 41A, and formed of a GaN layer with a thickness of about 5 nm.

A second pair layer 42 is composed of a second well layer 42A and a second barrier layer 42B, and formed on the first pair layer 41. The second well layer 42A is disposed on the n-semiconductor layer side in relation to the second barrier layer 42B, and formed of an $In_{0.26}Ga_{0.74}N$ layer with a thickness of about 39 Å. It is adapted to emit bluish light with an emission wavelength of 460 nm to 463 nm. The second well layer 42A is doped with an impurity, silicon (Si) at a doping amount of about $1 \times 10^{-7}$ $cm^{-3}$. The second barrier layer 42B is disposed on the p-semiconductor layer side in relation to the second well layer 42A, and formed of a GaN layer with a thickness of about 5 nm.

A third pair layer 43 is composed of a third well layer 43A and a third barrier layer 43B, and formed on the second pair layer 42. The third well layer 43A is disposed on the n-semiconductor layer side in relation to the third barrier layer 43B, and formed of an $In_{0.24}Ga_{0.76}N$ layer with a thickness of about 36 Å. It is adapted to emit bluish light with an emission wavelength of 460 nm to 463 nm. The third well layer 43A is doped with an impurity, silicon (Si) at a doping amount of about $2 \times 10^{-7}$ $cm^{-3}$. The third barrier layer 43B is disposed on the p-semiconductor layer side in relation to the third well layer 43A, and formed of a GaN layer with a thickness of about 5 nm.

A fourth pair layer 44 is composed of a fourth well layer 44A and a fourth barrier layer 44B, and formed on the third pair layer 43. The fourth well layer 44A is disposed on the n-semiconductor layer side in relation to the fourth barrier layer 44B, and formed of an $In_{0.22}Ga_{0.78}N$ layer with a thickness of about 33 Å. It is adapted to emit bluish light with an emission wavelength of 460 nm to 463 nm. The fourth well layer 44A is doped with an impurity, silicon (Si) at a doping amount of about $3 \times 10^{-7}$ $cm^{-3}$. The fourth barrier layer 44B is disposed on the p-semiconductor layer side in relation to the fourth well layer 44A, and formed of a GaN layer with a thickness of about 5 nm.

A fifth pair layer 45 is composed of a fifth well layer 45A and a fifth barrier layer 45B, and formed on the fourth pair layer 44. The fifth well layer 45A is disposed on the n-semiconductor layer side in relation to the fifth barrier layer 45B, and formed of an $In_{0.20}Ga_{0.80}N$ layer with a thickness of about 30 Å. It is adapted to emit bluish light with an emission wavelength of 460 nm to 463 nm. The fifth well layer 45A is doped with an impurity, silicon (Si) at a doping amount of about $4 \times 10^{-7}$ $cm^{-3}$. The fifth barrier layer 45B is disposed on the p-semiconductor layer side in relation to the fifth well layer 45A, and formed of a GaN layer with a thickness of about 5 nm.

A sixth pair layer 46 is composed of a sixth well layer 46A and a sixth barrier layer 46B, and formed on the fifth pair layer 45. The sixth well layer 46A is disposed on the n-semiconductor layer side in relation to the sixth barrier layer 46B, and formed of an $In_{0.18}Ga_{0.82}N$ layer with a thickness of about 27 Å. It is adapted to emit bluish light with an emission wavelength of 460 nm to 463 nm. The sixth well layer 46A is doped with an impurity, silicon (Si) at a doping amount of about $5 \times 10^{-7}$ $cm^{-3}$. The sixth barrier layer 46B is disposed on the p-semiconductor layer side in relation to the sixth well layer 46A, and formed of a GaN layer with a thickness of about 5 nm.

A seventh pair layer 47 is composed of a seventh well layer 47A and a seventh barrier layer 47B, and formed on the sixth pair layer 46. The seventh well layer 47A is disposed on the n-semiconductor layer side in relation to the seventh barrier layer 47B, and formed of an $In_{0.16}Ga_{0.84}N$ layer with a thickness of about 24 Å. It is adapted to emit bluish light with an emission wavelength of 460 nm to 463 nm. The seventh well layer 47A is doped with an impurity, silicon (Si) at a doping amount of about $6 \times 10^{-7}$ $cm^{-3}$. The seventh barrier layer 47B is disposed on the p-semiconductor layer side in relation to the seventh well layer 47A, and formed of a GaN layer with a thickness of about 5 nm.

The eighth pair layer 48 is composed of an eighth well layer 48A and an eighth barrier layer 48B, and formed on the seventh pair layer 47. The eighth well layer 48A is disposed on the n-semiconductor layer side in relation to the eighth barrier layer 48B, and formed of an $In_{0.14}Ga_{0.86}N$ layer with a thickness of about 21 Å. It is adapted to emit bluish light with an emission wavelength of 460 nm to 463 nm. The eighth well layer 48A is doped with an impurity, silicon (Si) at a doping amount of about $7 \times 10^{-7}$ $cm^{-3}$. The eighth barrier layer 48B is disposed on the p-semiconductor layer side in relation to the eighth well layer 48A, and formed of a GaN layer with a thickness of about 5 nm.

The In (indium) composition ratio, thickness and Si doping concentration of the first well layer 41A to the eighth well layer 48A are as shown in Table 3.

TABLE 3

| | In composition ratio (%) | Thickness (Å) | Si doping amount ($cm^{-3}$) |
|---|---|---|---|
| Eighth well layer | 14 | 21 | $7 \times 10^{-7}$ |
| seventh well layer | 16 | 24 | $6 \times 10^{-7}$ |
| Sixth well layer | 18 | 27 | $5 \times 10^{-7}$ |
| Fifth well layer | 20 | 30 | $4 \times 10^{-7}$ |
| Fourth well layer | 22 | 33 | $3 \times 10^{-7}$ |
| Third well layer | 24 | 36 | $2 \times 10^{-7}$ |
| Second well layer | 26 | 39 | $1 \times 10^{-7}$ |
| First well layer | 29 | 42 | 0 |

The same effects as the first embodiment can be obtained by the third embodiment as mentioned above.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

For example, the following modifications can be made according to the invention.

(1) In the above embodiments, the composition ratios of the plural InGaN well layers are set different from each other such that emission wavelengths thereof coincide with each other. However, the invention is not limited to this. For example, the plural InGaN well layers may comprise different bandgap widths. In this case, it is desired that the bandgap width of the plural well layers increases gradually from the n-semiconductor layer side to the p-semiconductor layer side.

(2) In the above embodiments, the light emitting layer (i.e., MQW layer) has 4, 6 or 8 pair layers. However, the invention is not limited to this. The number of the pair layers can be arbitrarily changed on condition that the pair layers are formed such that a barrier layer is stacked on the p-semiconductor layer side of a well layer.

(3) In the above embodiments, the barrier layer of each pair layer is formed of GaN. However, the invention is not limited to this. For example, the barrier layer may be formed of GaN-based semiconductor comprising at least a composition ratio represented by $Al_xGa_{1-x}N$ (where $0 \leq x \leq 1$).

(4) In the above embodiments, the group III nitride semiconductor light emitting element is an LED element. However, the invention is not limited to this. For example, it may be an LD element.

What is claimed is:

1. A group III nitride semiconductor light emitting element for emitting blue, green or violet light, comprising;
    a light emitting layer comprising a multiquantum well structure comprising a group III nitride semiconductor,
    wherein the light emitting layer comprises a plurality of well layers,
    wherein the plurality of well layers are formed different from each other in composition ratio of InGaN or bandgap width such that each of the plurality of well layers comprise substantially a same emission wavelength,
    wherein the plurality of well layers comprises InGaN, and the plurality of well layers are different from each other in thickness, and
    wherein the light emitting element further comprises an n-semiconductor layer and a p-semiconductor layer, and the thickness decreases in a direction from the n-semiconductor layer to the p-semiconductor layer.

2. A group III nitride semiconductor light emitting element for emitting blue, green or violet light, comprising:
    a light emitting layer comprising a multiquantum well structure comprising a group III nitride semiconductor,
    wherein the light emitting layer comprises a plurality of well layers,
    wherein the plurality of well layers are formed different from each other in composition ratio of InGaN or bandgap width such that each of the plurality of well layers comprise substantially a same emission wavelength,
    wherein the light emitting layer comprises a plurality of pair layers, each of the pair layers comprising a well layer and a barrier layer, the light emitting element further comprises a p-semiconductor layer, and a distance between the barrier layer and the p-semiconductor layer is less than a distance between the well layer and the p-semiconductor layer, and
    wherein the plurality of well layers decrease in thickness from a well layer of the plurality of well layers furthest from the p-semiconductor layer to a well layer of the plurality of well layers closest to the p-semiconductor layer.

* * * * *